(12) United States Patent
Cheng et al.

(10) Patent No.: US 12,176,247 B2
(45) Date of Patent: Dec. 24, 2024

(54) METAL OXIDE COMPOSITE AS ETCH STOP LAYER

(71) Applicant: Taiwan Semiconductor Manufacturing Co., Ltd., Hsin-Chu (TW)

(72) Inventors: Kai-Fang Cheng, Taoyuan (TW); Chi-Lin Teng, Taichung (TW); Hsin-Yen Huang, New Taipei (TW); Hai-Ching Chen, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 61 days.

(21) Appl. No.: 17/728,295

(22) Filed: Apr. 25, 2022

(65) Prior Publication Data

US 2022/0246468 A1     Aug. 4, 2022

Related U.S. Application Data

(62) Division of application No. 16/451,432, filed on Jun. 25, 2019, now Pat. No. 11,315,828.

(Continued)

(51) Int. Cl.
| | |
|---|---|
| *H01L 21/02* | (2006.01) |
| *H01L 21/31* | (2006.01) |
| *H01L 21/311* | (2006.01) |
| *H01L 21/3213* | (2006.01) |
| *H01L 21/768* | (2006.01) |

(52) U.S. Cl.
CPC .. *H01L 21/76829* (2013.01); *H01L 21/02126* (2013.01); *H01L 21/02178* (2013.01); *H01L 21/02181* (2013.01); *H01L 21/02189* (2013.01); *H01L 21/02244* (2013.01); *H01L 21/02252* (2013.01); *H01L 21/0228* (2013.01); *H01L 21/31144* (2013.01); *H01L 21/32139* (2013.01)

(58) Field of Classification Search
CPC ......... H01L 21/76807; H01L 21/02126; H01L 21/31633; H01L 21/0228
See application file for complete search history.

(56) References Cited

U.S. PATENT DOCUMENTS

| | | | |
|---|---|---|---|
| 6,297,162 B1 * | 10/2001 | Jang ................ | H01L 21/3145 |
| | | | 257/E21.507 |
| 6,465,372 B1 | 10/2002 | Xia et al. | |

(Continued)

FOREIGN PATENT DOCUMENTS

| | | |
|---|---|---|
| EP | 0678913 A1 | 10/1995 |
| KR | 20080025213 A | 3/2008 |

(Continued)

*Primary Examiner* — Anthony Ho
*Assistant Examiner* — David J Goodwin
(74) *Attorney, Agent, or Firm* — HAYNES AND BOONE, LLP

(57) ABSTRACT

A semiconductor device includes a substrate, a first conductive feature disposed in a top portion of the substrate, a metal containing layer disposed on the first conductive feature, and a second conductive feature disposed on and through the metal containing layer and in physical contact with the first conductive feature. The metal containing layer includes an M—O—X group, M representing a metal atom, O representing an oxygen atom, and X representing an element other than hydrogen.

20 Claims, 13 Drawing Sheets

Related U.S. Application Data

(60) Provisional application No. 62/764,867, filed on Aug. 15, 2018.

(56) References Cited

U.S. PATENT DOCUMENTS

| | | | | |
|---|---|---|---|---|
| 6,852,635 | B2* | 2/2005 | Satta | H01L 23/53252 |
| | | | | 257/E21.171 |
| 9,922,927 | B2 | 3/2018 | Wu et al. | |
| 2005/0112282 | A1* | 5/2005 | Gordon | C23C 16/45534 |
| | | | | 427/255.18 |
| 2005/0208778 | A1* | 9/2005 | Li | H01L 21/02145 |
| | | | | 257/E21.546 |
| 2008/0032064 | A1* | 2/2008 | Gordon | C23C 16/402 |
| | | | | 427/255.4 |
| 2008/0073694 | A1* | 3/2008 | Willer | H10B 41/41 |
| | | | | 257/E21.691 |
| 2010/0252930 | A1 | 10/2010 | Liao et al. | |
| 2011/0018134 | A1 | 10/2011 | Streck et al. | |
| 2011/0272810 | A1* | 11/2011 | Clevenger | H01L 21/02282 |
| | | | | 430/312 |
| 2014/0141611 | A1 | 5/2014 | Chou et al. | |
| 2014/0329353 | A1 | 11/2014 | JangJian et al. | |
| 2015/0311114 | A1 | 10/2015 | Huang et al. | |
| 2016/0240428 | A1 | 8/2016 | Tung et al. | |
| 2016/0358854 | A1 | 12/2016 | JangJian et al. | |
| 2017/0018458 | A1 | 1/2017 | Cheng et al. | |
| 2017/0125340 | A1 | 5/2017 | Tsai et al. | |
| 2018/0076140 | A1 | 3/2018 | Kim et al. | |
| 2018/0218980 | A1 | 8/2018 | Rha et al. | |
| 2019/0017170 | A1 | 1/2019 | Sharma et al. | |
| 2020/0402808 | A1* | 12/2020 | Tsai | H01L 21/31116 |
| 2023/0175129 | A1* | 6/2023 | Winkler | C23C 16/08 |
| | | | | 438/758 |

FOREIGN PATENT DOCUMENTS

| | | |
|---|---|---|
| KR | 20180002473 A * | 1/2018 |
| TW | 200536051 A | 11/2005 |

* cited by examiner

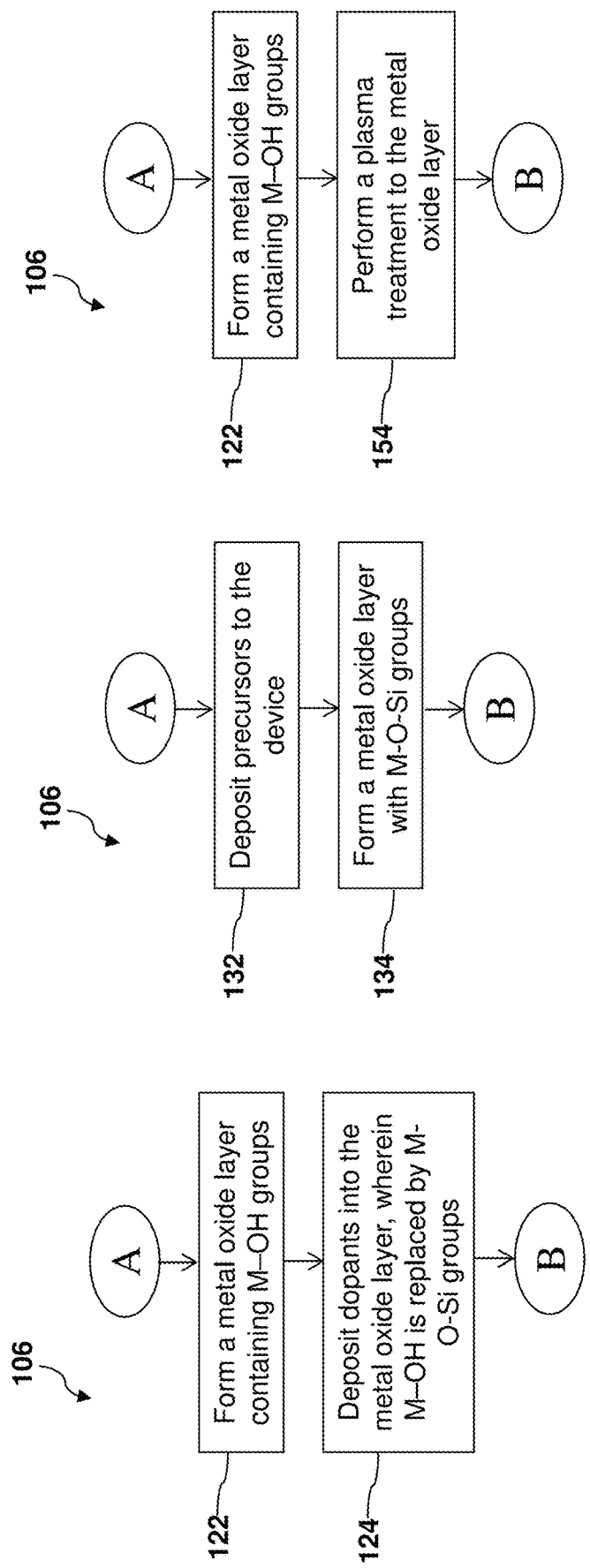

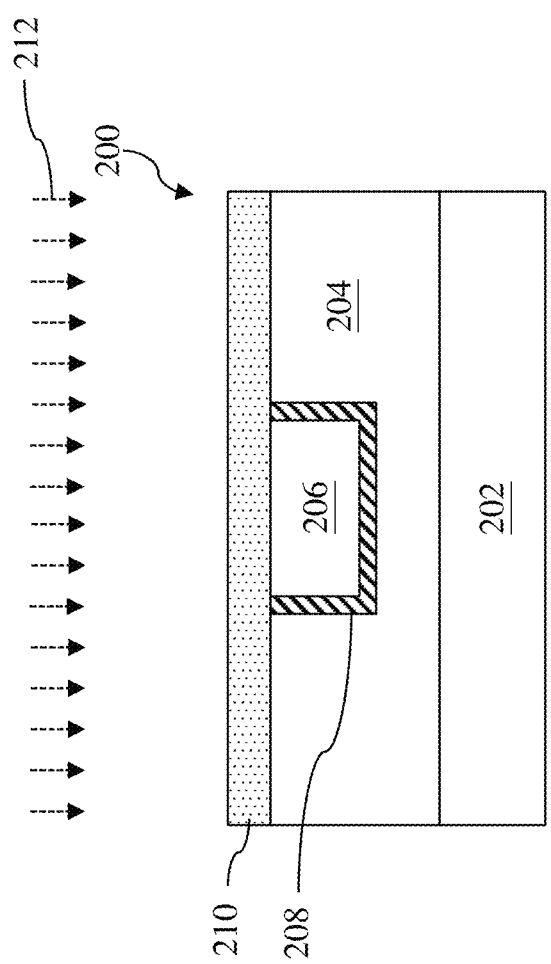

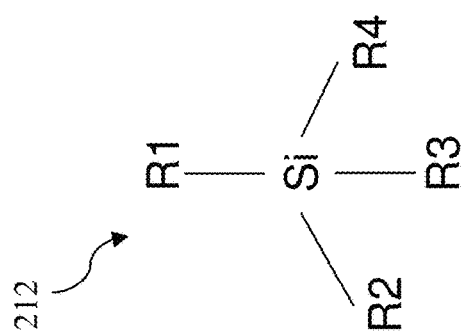
Fig. 6
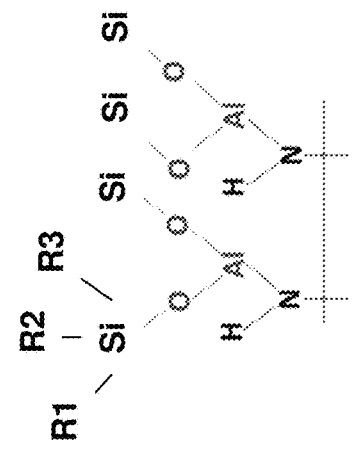
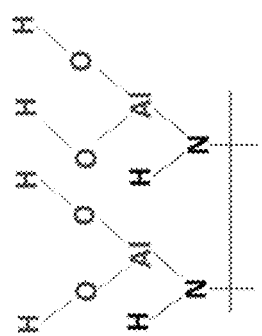
Fig. 7

METAL OXIDE COMPOSITE AS ETCH STOP LAYER

PRIORITY DATA

This is a divisional application of U.S. patent application Ser. No. 16/451,432, filed Jun. 25, 2019, which claims priority to U.S. Provisional Patent Application Ser. No. 62/764,867, filed Aug. 15, 2018, the entire disclosures of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As a part of the semiconductor fabrication, conductive elements may be formed to provide electrical interconnections for various components in an IC. For example, conductive lines and vias for interconnecting different metal layers may be formed by etching openings in an inter-metal dielectric (IMD) layer. Metal oxide composite may be used to form etch stop layers for end point control, providing high etch selectivity. However, hydroxyl group (—OH) is often found in metal oxide containing layers, which may cause oxidation of metal elements in underneath conductive features. Therefore, while etch stop layer formation processes have generally been adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C, and 1D show a flow chart of a method for forming a semiconductor device with an etch stop layer, according to some embodiments.

FIGS. 2, 3, 5, 9, 10, 11, 12, and 13 illustrate sectional views of a semiconductor structure during a fabrication process according to the method of FIGS. 1A, 1B, 1C, and 1D, according to aspects of the present disclosure.

FIGS. 4, 6, 7, 8, and 14 illustrate exemplary formulas of metal oxide composite and associated physical properties.

DETAILED DESCRIPTION

Figure 1A:
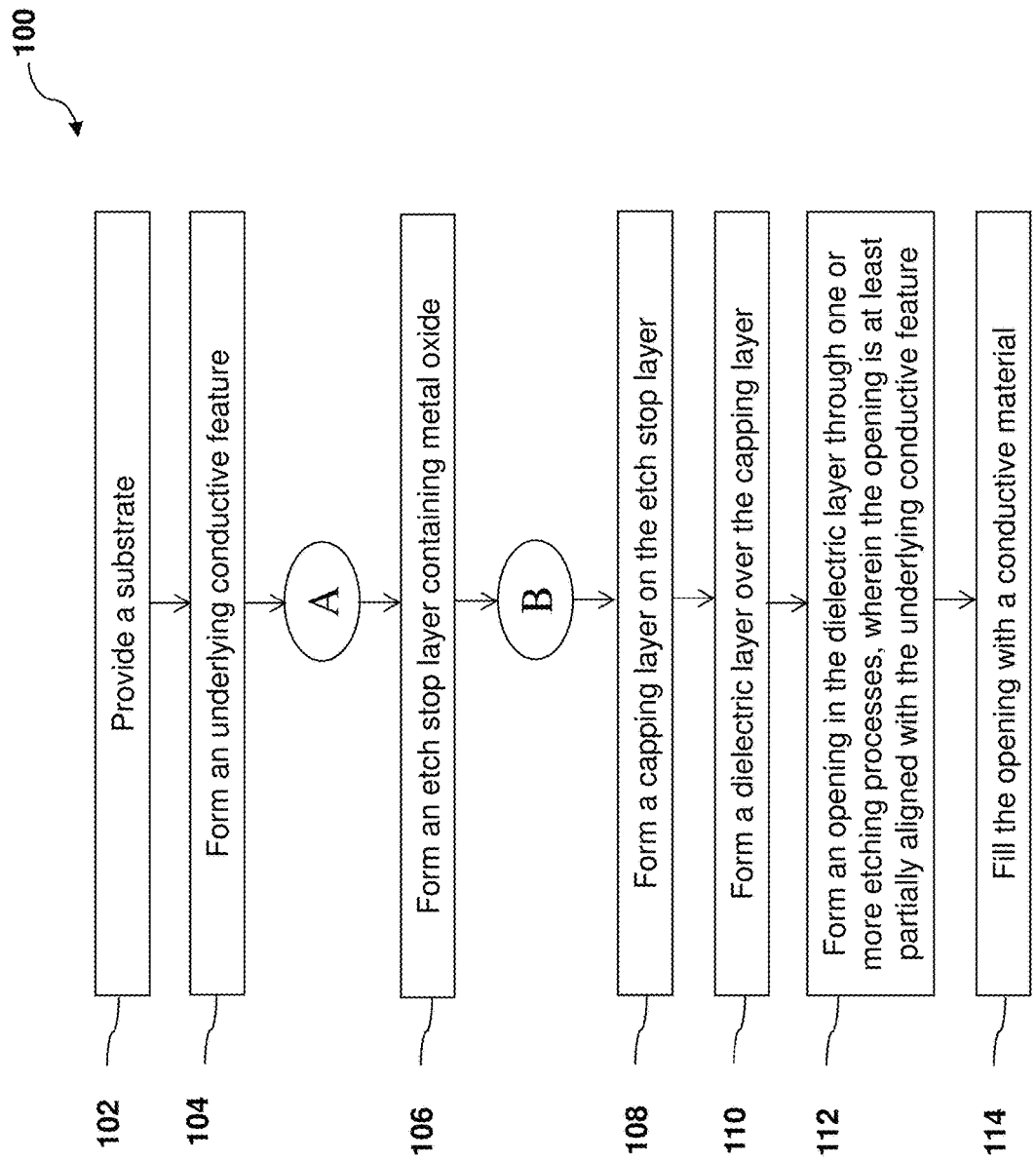

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

This invention is related generally to integrated circuits, and more particularly to interconnect structures in integrated circuits and methods for forming the same, and even more particularly to the formation of etch stop layers.

Integrated circuits contain a plurality of patterned metal lines separated by inter-wiring spacings. Typically, the metal patterns of vertically spaced metallization layers are electrically interconnected by vias. Metal lines formed in trench-like openings typically extend substantially parallel to the semiconductor substrate. Semiconductor devices of such type, according to current technology, may comprise eight or more levels of metallization layers to satisfy device geometry and micro-miniaturization requirements.

A common process for forming metal lines or plugs is known as "damascene." Generally, this process involves forming an opening in the dielectric interlayer, which separates the vertically spaced metallization layers. The opening is typically formed using conventional lithographic and etching techniques. After an opening is formed, the opening is filled with metal or metal alloys, such as copper or copper alloys in some embodiments, to form a metal line and possibly a via. Excess metal material on the surface of the dielectric interlayer is then removed by chemical mechanical planarization (CMP).

To accurately control the formation of the damascene opening, etch stop layers are commonly used. An etch stop layer stacked between an underlying conductive feature (e.g., a metal line) and a dielectric interlayer (e.g., a low-k dielectric layer) provides isolation as a barrier layer and also provides end point control during subsequent etching processes when openings are formed in the dielectric interlayer.

Material compositions of an etch stop layer are selected such that an etch selectivity exists between the etch stop layer and the dielectric interlayer, such that an etching process etching through the dielectric interlayer would stop at the etch stop layer without causing etching damages to the underlaying conductive feature. The term "etch selectivity" used herein refers to the etching rate of the etch stop layer divided by the etching rate of the dielectric interlayer. For example, an etch selectivity of about 10 would result in the dielectric interlayer being removed during an etching process at a rate that is about 10 times faster than the etch stop layer being removed.

Metal oxide containing material (also referred to as metal oxide composite) generally provides high etch selectivity to low-k dielectric materials. Therefore, an etch stop layer may comprise metal oxide composite, such as aluminum oxide or aluminum oxynitride, in modern technology nodes. Nonetheless, an etch stop layer containing metal oxide still suffers drawbacks. Metal oxide containing material often includes hydroxyl group (—OH), which contains oxygen bonded to hydrogen. Hydroxyl groups spread throughout the metal oxide containing material, but with the highest concentration on the top surface of an etch stop layer. Hydroxyl groups are formed by dissociative chemisorption of $H_2O$ molecules, and it is generally considered that hydration and hydroxylation occur at exposed lattice metal ion sites on the surface as the lattice metal ions are strong Lewis acids. Majority of hydroxyl groups is in the form of surface hydroxyl group that stays on the surface of the etch stop layer. When an etch stop layer is thick, concentration of hydroxyl groups decreases sharply when the distance is away from the surface. However, when an etch stop layer is thin, such as less than about 100 Å (Angstrom), the concentration of hydroxyl groups at the bottom of the etch stop layer may still be high enough to cause oxidation of metal elements inside underlying conductive features. Further, it becomes easier for some surface hydroxyl group to permeate to the underneath interface with the underlying conductive feature and oxidize the metal elements therein. This oxidation creates voids, sometimes in nanometer scale, in the underlying conductive feature where the volume of metal is consumed by oxidation. One way to mitigate void formation is to increase an etch stop layer's thickness to increase depth for hydroxyl groups' concentration to drop below certain threshold. In some embodiments, an etch stop layer is as thick as about 10 nm to about 20 nm to avoid oxidation. As semiconductor technology generations continue the scaling-down process, a thick etch stop layer increases parasitic capacitance and decreases speed of the semiconductor device. A solution is thus needed.

The making and using of the embodiments of the present invention are discussed in detail below. A method significantly reduces or substantially eliminates hydroxyl groups from an etch stop layer and a resulting novel interconnect structure of integrated circuits, which allows an etch stop layer with a thickness less than 50 Å (e.g., as thin as about 20 Å), are provided. The intermediate stages of manufacturing the embodiment are illustrated. The variations of the embodiment are discussed. Throughout the various views and illustrative embodiments of the present invention, like reference numbers are used to designate like elements. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

FIGS. 1A, 1B, 1C, and 1D illustrate a flowchart of a method 100 to form an integrated circuit in accordance with some embodiments. Additional steps can be provided before, during, and after the method 100, and some of the steps described can be replaced or eliminated for other embodiments of the method 100. The method 100 is described below in conjunction with FIGS. 2-14. FIGS. 2, 3, 5, 9, 10, 11, 12, and 13 illustrate sectional views of an exemplary integrated circuit 200 during various fabrication stages of the method 100 in accordance with some embodiments. FIGS. 4, 6, 7, 8, and 14 illustrate exemplary formulas of metal oxide composite and associated physical properties.

Figure 2:
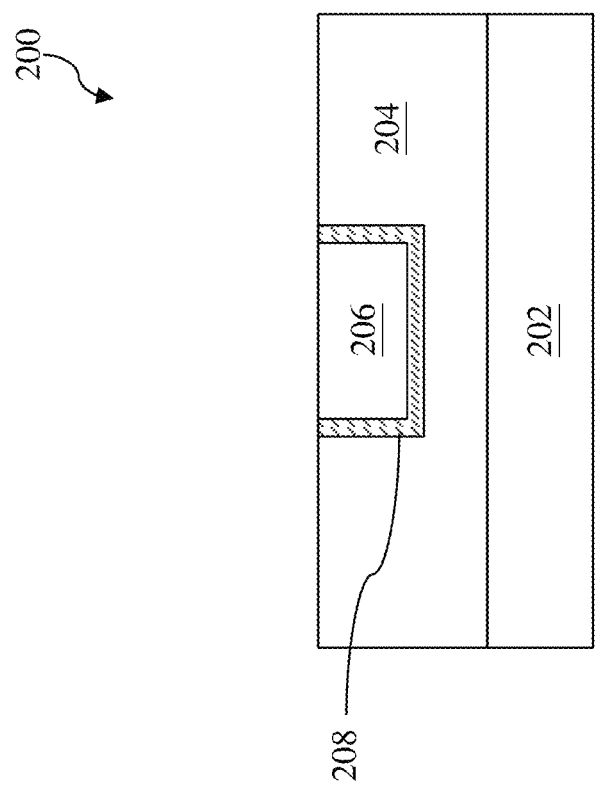
Figure 4:
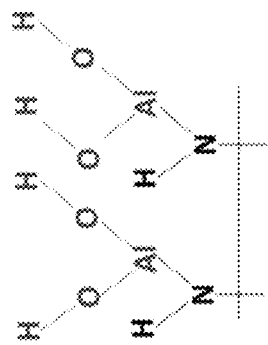

Referring to FIG. 1A, the method 100 begins at operation 102 by providing or receiving a device 200 including a substrate 202 as illustrated in FIG. 2. In some embodiments, the substrate 202 includes silicon. Alternatively, the substrate 202 may include other elementary semiconductor such as germanium in accordance with some embodiments. In some embodiments, the substrate 202 additionally or alternatively includes a compound semiconductor such as silicon carbide, gallium arsenic, indium arsenide, and indium phosphide. In some embodiments, the substrate 202 includes an alloy semiconductor such as silicon germanium, silicon germanium carbide, gallium arsenic phosphide, and gallium indium phosphide.

In some embodiments, the substrate 202 includes a semiconductor-on-insulator (SOI) structure. For example, the substrate may include a buried oxide (BOX) layer formed by a process such as separation by implanted oxygen (SIMOX). In various embodiments, the substrate 202 includes various p-type doped regions and/or n-type doped regions, such as p-type wells, n-type wells, p-type source/drain features and/or n-type source/drain features, formed by a process such as ion implantation and/or diffusion. The substrate 202 may include other functional features such as a resistor, a capacitor, diode, transistors, such as field effect transistors (FETs). The substrate 202 may include lateral isolation features configured to separate various devices formed on the substrate 202.

The substrate 202 may include a dielectric layer 204 formed on the top surface. In some embodiments, the dielectric layer 204 is an inter-metal dielectric (IMD) having a dielectric constant value (k value) ranging from about 1 to about 5, for example, a low-k value lower than about 3.5. A low-k dielectric layer may comprise commonly used low-k dielectric materials, such as carbon-containing dielectric materials, and may further contain nitrogen, hydrogen, oxygen, and combinations thereof.

Still referring to FIGS. 1A and 2, the method 100 includes an operation 104 by forming a diffusion barrier layer 208 and one or more underlying conductive features 206 embedded in the dielectric layer 204. The diffusion barrier layer 208 may include titanium, titanium nitride, tantalum, tantalum nitride, or other alternatives. In the embodiment illustrated in FIG. 2, one underlying conductive feature 206 is formed.

In some embodiments, the underlying conductive feature 206 is a metal feature, such as a metal line, a metal via, or a metal contact feature. In some embodiments, the underlying conductive feature 206 includes both a metal line and a metal via, formed by a suitable procedure, such as dual damascene process, or other suitable process including atomic layer deposition (ALD), chemical vapor deposition (CVD), physical vapor deposition (PVD), electroless metal deposition (ELD), or electrochemical plating (ECP) process. The material of the underlying conductive feature 206 may include copper (Cu) or copper alloys. Alternatively, it may also be formed of, or comprise, other conductive materials, such as Nickel (Ni), Cobalt (Co), Ruthenium (Ru), Iridium (Ir), Aluminum (Al), Platinum (Pt), Palladium (Pd), Gold (Au), Silver (Ag), Osmium (Os), Tungsten (W), and the like. The steps for forming the underlying conductive feature 206 may include forming a damascene opening in the low-k dielectric layer 204, forming the diffusion barrier layer 208 in the damascene opening, depositing a thin seed layer of copper or copper alloy, and filling the damascene opening, for example, by plating. A chemical mechanical planarization (CMP) is then performed to level surfaces, resulting in the structure as shown in FIG. 2.

Alternatively, the underlying conductive feature 206 can be other conductive features. In some embodiments, the underlying conductive feature 206 is a doped semiconductor feature, such as a source/drain feature, without being surrounded by the diffusion barrier layer 208. In furtherance of the embodiments, silicide is formed on the top surface of the doped semiconductor feature. In some embodiments, the underlying conductive feature 206 is a gate electrode, a capacitor, or resistor. In furtherance of the embodiments, metal is formed on the top surface of the gate electrode (such as metal gate), the capacitor (such as metal electrode of the capacitor) or resistor.

In the embodiments illustrated in FIG. 2, the underlying conductive feature 206 is a metal line in one metal layer of a multilayer interconnection (MLI) structure. The MLI structure includes metal lines in a plurality of metal layers. The metal lines in different metal layers may be connected through vertical conductive features, which are referred to as via features. The multilayer interconnection structure further includes contacts configured to connect metal lines to gate electrodes and/or doped features on the substrate 202. The MLI structure is designed to couple various devices features (such as various p-type and n-type doped regions, gate electrodes and/or passive devices) to form a functional circuit. In furtherance of the embodiment, the dielectric layer 204 is the first dielectric material layer of the MLI structure, and the underlying conductive feature 206 is a metal line in a bottom metal layer of the MLI structure.

Figure 3:
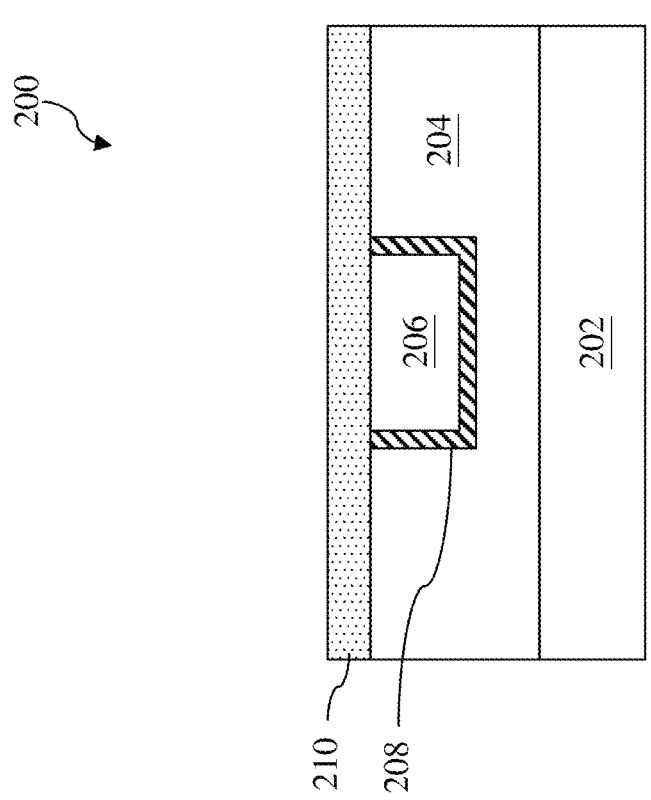

Referring to FIGS. 1 and 3, the method 100 proceeds to operation 106 by forming an etch stop layer 210 on the dielectric layer 204 and the underlying conductive feature 206. In some embodiments, the etch stop layer 210 includes a metal oxide composite. In the metal oxide composite, some metal atoms are bonded with oxygen atoms and some metal atoms are not. Metal-oxygen bonding (M-O bonding, with M representing the metal element) concentration is defined as the number of the metal atoms bonded with oxygen over the total number of the metal atoms in a given volume. The M-O bonding concentration may be simply referred to as oxygen concentration. When the metal oxide has a higher oxygen concentration, more metal atoms are bonded with oxygen, and vice versa. In some examples, the metal oxide has an M-O bonding concentration greater than 80%, such as about 90%. In other examples, the metal oxide has an M-O bonding concentration from about 30% to about 60%, such as about 50%.

In some embodiments, the etch stop layer 210 includes a metal oxide, nitride, oxynitride, or a combination thereof, with containing metal selected from the group consisting of Hafnium (Hf), Ruthenium (Ru), Zirconium (Zr), Aluminum (Al), Titanium (Ti), or a combination thereof. The etch stop layer 210 may be deposited by ALD, CVD, PVD, spin coating process, or other suitable methods.

As will be further described in conjunction with FIGS. 1B, 1C, and 1D, operation 106 includes special treatments that significantly reduce or substantially eliminate hydroxyl group from the etch stop layer 210. Without such special treatments, the etch stop layer would otherwise be rich of hydroxyl group (especially for surface hydroxyl group) and the M-O bonding may be part of a material composition represented by a formula below:

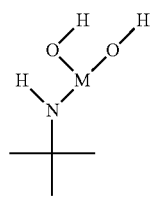

In this specific example, the metal oxide composition further includes nitrogen, where metal element is bonded between nitrogen and oxygen, and oxygen is further bonded with hydrogen, thereby forming hydroxyl group (—OH). In other words, M-O bond is part of M-OH group (or N-M-OH group). As discussed above, in some embodiments, the metal can be one of Hafnium (Hf), Ruthenium (Ru), Zirconium (Zr), Aluminum (Al), and Titanium (Ti), or a combination thereof. In furtherance of the embodiments, the metal in the etch stop layer 210 is Aluminum (Al), and the metal oxide composition can be represented by a formula illustrated in FIG. 4. The etch stop layer containing Aluminum oxide and rich of hydroxyl groups may have a density about 2.64 $g/cm^3$.

Hydroxyl group has the highest concentration on the top surface of the etch stop layer. Small amount of hydroxyl group also exists under the top surface, even at proximate regions to the underneath conductive feature 206. Since hydroxyl group may permeate to oxidize the underneath conductive feature 206, there is often a need for the etch stop layer to be thick, such as about 10 nm to about 20 nm, to reduce hydroxyl group concentration near its bottom surface to prevent the metal capped underneath from oxidation. The various embodiments of special treatments in operation 106 to be discussed below allow the etch stop layer 210 to be substantially free of hydroxyl group and achieve a thickness less than about 50 Å, such as a thickness ranging from about 10 Å to about 30 Å (e.g., 20 Å) in some specific examples.

Referring to FIG. 1B, in one embodiment, operation 106 includes step 122 to form a metal oxide layer as the etch stop layer 210. The metal oxide layer contains M-OH groups. In an exemplary embodiment, step 122 includes an ALD process. In furtherance of the embodiments, the formation of the etch stop layer 210 uses a metal-containing chemical and an oxygen-containing chemical (such as sequentially) in each cycle of the ALD process. For examples, the metal-containing chemical includes Tetrakis(ethylmethylamino) Hafnium (TEMA-Hf), Tetrakis(ethylmethylamido) Zirconium (TEMA-Zr), Trimethyl Aluminum (TMA), Tris(dimethylamido) Aluminum (TDMAA), and a combination thereof. In various examples, TEMA-Hf is used to form Hafnium oxide; TEMA-Zr is used to form Zirconium oxide; and TMA or TDMAA is used to form Aluminum oxide. The oxygen-containing chemical includes oxygen molecules ($O_2$), ozone ($O_3$), water ($H_2O$) or a combination thereof, according to some embodiments.

The etch stop layer 210 may be formed by a proper ALD process, such as thermal ALD with an elevated temperature, plasma ALD with plasma enhancement, or thermal plus plasma ALD. In some embodiments, the ALD process to form the etch stop layer 210 includes a process temperature ranging from about 200° C. to about 400° C. In some embodiments, the ALD process to form the etch stop layer 210 includes a process temperature ranging from about 50° C. to about 100° C., and a vapor pressure ranging from about 0.05 Torr to about 0.5 Torr for the metal-containing chemical. In one example, the ALD process to form the etch stop layer 210 includes a process temperature at about 70° C., and a vapor pressure ranging from about 0.05 Torr to about 0.2 Torr for TEMA-Hf or TEMA-Zr. In another example, the ALD process to form the etch stop layer 210 includes a process temperature at about 70° C. and a vapor pressure ranging from about 0.1 Torr to about 0.4 Torr for TMA. In yet another particular example, the ALD process to form the etch stop layer 210 includes a process temperature at about 70° C. and a vapor pressure ranging between 50 Torr to 200 Torr for TDMAA.

Still referring to FIG. 1B, in one embodiment, operation 106 further includes step 124 to deposit dopants 212 (FIG. 5) into the metal oxide containing material. In the illustrated embodiment, the dopants include silicon-based monomers. A monomer is a molecule that is capable but not subject to crosslink with other monomers. A silicon-based monomer reacts with hydroxyl group and replaces M-OH group with M-O—Si group. Step 124 may be an in-situ doping process with step 122, which means that steps 122 and 124 may be performed in the same process chamber. Further, vacuum break may not occur between steps 122 and 124. In some embodiments, dopant source is introduced in a dopant bath at a temperature in a range of between about 350° C. and 400° C., at a pressure in a range of between about 500 mTorr and 800 mTorr, such as by utilizing rapid thermal chemical vapor deposition techniques. In some embodiments, silicon-based monomer is implanted into the etch stop layer 210 by plasma immersion implantation techniques. In some alternative embodiments, the etch stop layer 210 is rinsed by a silicon-based monomer containing solution followed by a heating process to evaporate the solution to remain silicon-based monomers on the surface of the etch stop layer 210.

FIG. 6 shows an exemplary formula of a silicon-based monomer as a dopant. The silicon-based monomer 212 includes functional groups on all four sides of a silicon atom. Specifically, four sides of the monomer 212 include functional groups R1, R2, R3, and R4, where each functional group may independently be the same or different from one or other functional groups. In one example, the monomer 212 has four identical functional groups, such as four methyl groups. In another example, the monomer 212 has four different functional groups. Each functional group may independently represent a variety of elements or molecules including but not limited to hydrogen, methyl, or ethyl. In furtherance of some embodiments, a functional group may not directly bond with the Si atom, but through an oxygen, forming a Si—O—R group. In some embodiments, one or more functional groups may be able to provide crosslinking capability with another monomer.

In some embodiments, the monomer 212 may include a site being an alkyl group having 1-20 carbons ($C_1$-$C_{20}$) with a non-cyclic structure or a cyclic structure. For example, the cyclic structure may be an aromatic ring. In other examples, the alkyl group further includes a functionalized group, such as —I, —Br, —Cl, —$NH_2$, —COOH, —OH, —SH, —$N_3$, —S(=O)—, alkene, alkyne, imine, ether, ester, aldehyde, ketone, amide, sulfone, acetic acid, cyanide, or a combination thereof. In some embodiments, the monomer 212 may include a site being an aromatic group or a heterocyclic group. The aromatic group may include a chromophore and includes an alkyl group having 3-20 carbons ($C_3$-$C_{20}$). In some embodiments, the aromatic group can be phenyl, napthalenyl, phenanthrenyl, anthracenyl, phenalenyl, or other aromatic derivatives containing one to five-membered rings. In the present embodiment, each functional group is either methyl, ethyl, or phenyl.

A chemical reaction involving hydrogen in M-OH group to be replaced by silicon-based monomer (as illustrated in FIG. 7) can be described as a self-assembled monolayer formation. In a self-assembled monolayer formation, a functional group (e.g., R4) of the monomer interact through hydrogen-bonding to the metal oxide surface. Due to attractive forces such as van der Walls interactions between the alkyl chains and interactions between head groups (e.g., dipole-dipole interactions), the monomer order itself on the surface of the oxide and condensation of the R4 and metal oxide —OH groups happens. In an example of R4 being a —O—CH2CH3, the condensation creates an ethanol molecular (CH3CH2-OH) and bonds Si to oxygen in an M-O— group through a covalent bond, thereby forming an M-O—Si group. The other three functional groups (R1-R3) may remain on the other three sites of the Si atom. In FIG. 7, R1-R3 are only illustrated on one silicon atom for the sake of simplicity. The metal oxide composite can thus be denoted as $MO_xSi_yC_z$. By transferring M-OH group to M-O—Si group, hydroxyl group is eliminated and loses its oxidation capability.

Figure 8:
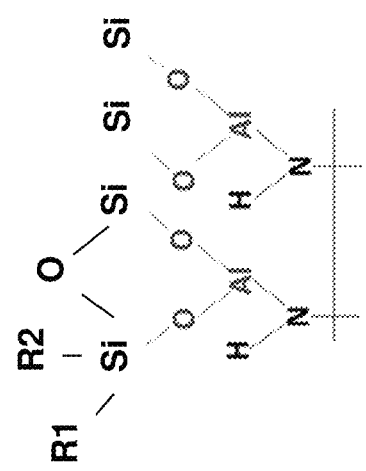

Step 124 may further include a plasma surface treatment, such as an Ar plasma surface treatment or a $CO_2$ plasma surface treatment, to facilitate reactions between hydroxyl group and silicon-based monomer to replace hydrogen in M-OH group with silicon (which can also be considered as a displacement reaction). In some embodiments, at least 80% of hydroxyl group is eliminated. In some embodiments, over 99% of hydroxyl group is eliminated. In some embodiments, step 124 may include a two-step heating process, which includes doping monomers and creating displacement reaction at a first temperature that is under a temperature threshold to trigger crosslinking reactions, then performing a baking process, which causes crosslinking reactions between monomers at a second temperature that is higher than the first temperature. During the baking process, silicon-containing monomers become unstable and constituent —Si—R component may readily hydrolyze and becomes —Si—OH. Another R from an adjacent —Si—R further snatches hydrogen from Si—OH component. Si—OH component becomes Si—O$^-$ after losing a hydrogen, which is more active in replacing other monomer's bonding between R group and Si, resulting in a Si—O—Si bond to connect two monomers. Particularly, an M-O—Si—O—Si-M group may be formed from the crosslinking action, as illustrated in FIG. 8. In furtherance of some embodiments, step 124 may further include another heating process with a third temperature higher than the first and second temperatures to drive out (e.g., to evaporate) crosslinking byproducts.

Figure 14:
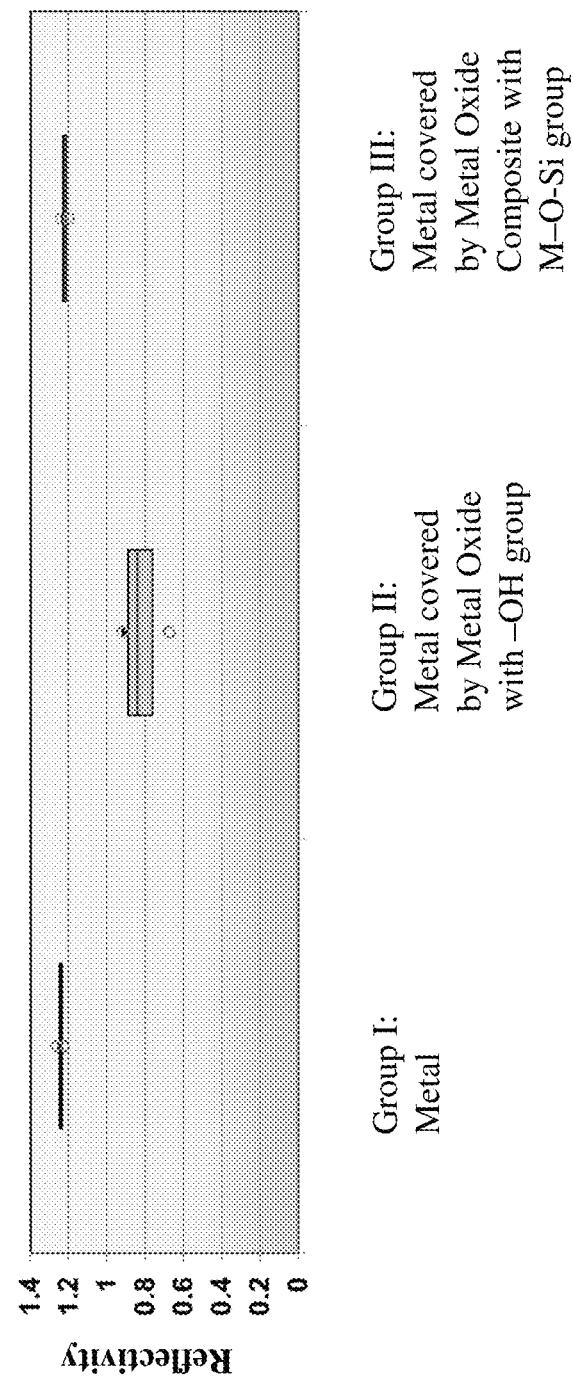

With hydrogen replaced by silicon, density of the etch stop layer 210 increases, such as an increasement from about 15% to about 40%. Taking Aluminum oxide containing material as an example, a density may increase from about 2.64 g/cm$^3$ to about 3.3 g/cm$^3$, an increasement of about 25%. The benefits of eliminating hydroxyl groups can be illustrated in FIG. 14, which shows different groups of underneath conductive features' measured reflectivity. Oxidation of a metal decreases its reflectivity. Therefore, reflectivity measurement serves as a benchmark for oxidation level of an underneath conductive feature. Group I in FIG. 14 shows reflectivity of the underneath conductive feature 206 before depositing an etch stop layer thereabove, which marks a reference point as a metal substantially without oxidation. In Group II, reflectivity drops significantly, showing that after a thin layer of etch stop layer is deposited thereabove, the underneath conductive feature 206 suffers oxidization. In Group III, as a comparison, for another underneath conductive feature 206 with an etch stop layer after hydroxyl group elimination treatment, reflectivity is substantially the same with Group I's reference point, which proves such a treatment protects the underneath conductive feature 206 from oxidation even with a rather thin etch stop layer.

Referring to FIG. 1C, in another embodiment, operation 106 includes step 132 to deposit precursors to the device 200 and step 134 to cause reactions between precursors to form an etch stop layer containing M-O—Si groups. One difference between FIGS. 1B and 1C is that operation 106 in FIG. 1C bypasses a step to create intermittent products of M-OH (e.g., step 122 in FIG. 1B), but to form M-O—Si directly. As an example, step 132 may include applying precursor gas of Trimethyl Aluminum (TMA). The process temperature may range from about 200° C. to about 400° C. under a process pressure between about 2.2 torr to about 2.4 torr. Step 132 may further include applying precursor gas containing silicon-based monomer, such as the monomers discussed above in association with FIG. 6. The oxidant gas may contain $H_2O$, $H_2$, $O_2$, $O_3$, or a combination thereof. Step 134 may include a plasma treatment, such as an Ar plasma treatment or a $CO_2$ plasma treatment to facilitate the formation of M-O—Si groups. In one example, the plasma treatment may be in a range from about 350° C. to about 400° C. for a duration of about 2 seconds to about 6 seconds per cycle during ALD process after a TMA soaking for about 4 seconds to about 12 seconds. Step 134 may further include a baking process to cause crosslinking actions between monomers, such as the one discussed above in association with FIG. 8.

Referring to FIG. 1D, in yet another embodiment, operation 106 includes step 122 similar to that in FIG. 1B to form a metal oxide layer containing M-OH groups. Operation 106 further includes step 154 which comprises exposing the etch stop layer to a plasma treatment to eliminate hydroxyl group. In some embodiments, the plasma treatment is an $N_2$ included plasma treatment or an $NH_3$ included plasma. The plasma may be generated using mixed-frequency radio frequency (RF) energy. RF energy is used in bands at about 13.56 MHz and about 350 kHz. The plasma treatment nitridizes and densifies the surface of the metal oxide layer to a depth of between about 10 Å to about 200 Å depending upon treatment time. The nitrification replaces hydrogen in hydroxyl groups with nitrogen. In other words, an M-OH group is transferred to an M-O—N group, which also weakens an etch stop layer's otherwise strong oxidation capability. In one example, the plasma treatment includes $NH_3$, under a temperature range of about 200° C. to about 400° C. for a duration of about 2 seconds to about 6 seconds under a pressure of about 2.2 torr to about 2.4 torr.

After operation 106, in various embodiments, most oxygen existing in M-O bonding becomes bonded with an element other than hydrogen, forming an M-O—X bonding (X represents the element other than hydrogen, e.g., Silicon or Nitrogen). Therefore, the concentration of hydroxyl group is heavily reduced. Further, since hydrogen before displacement has the highest concentration on a top surface of an etch stop layer, the element X also has the highest concentration on a top surface of an etch stop layer with a decreasing gradient of concentration when a depth is further away from the top surface. In other words, the element X has a higher concentration in an upper portion of an etch stop layer than in its lower portion.

Figure 9:
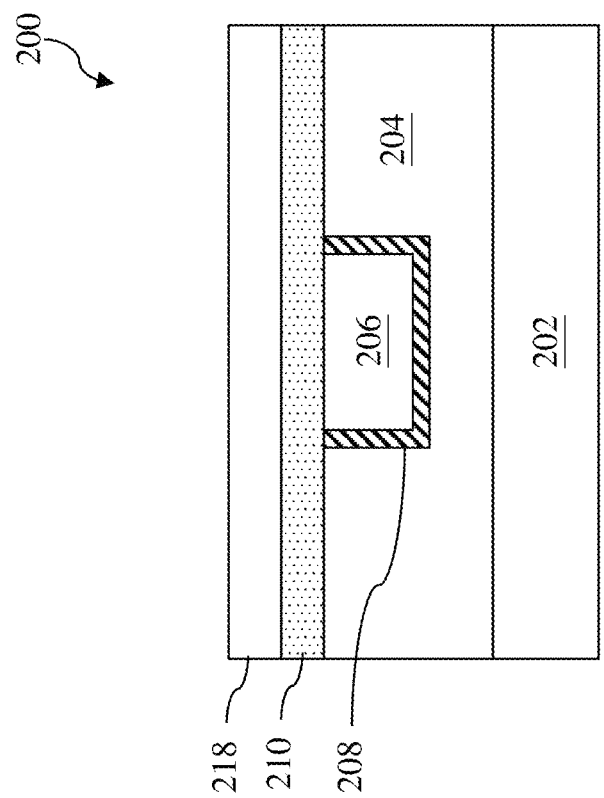

Referring to FIGS. 1A and 9, the method 100 proceeds to operation 108 by forming a capping layer 218 on the etch stop layer 210. The capping layer 218 has a composition different from that of the etch stop layer 210, and may be formed of nitrogen-free materials such as SiC, oxygen-doped silicon carbide (SiCO, also known as ODC), or other suitable materials. The capping layer 218 may be formed in-situ with the formation of the etch stop layer 210, which means that the etch stop layer 210 and the capping layer 218 may be formed in the same process chamber. Further, no vacuum break occurs between the formation of the etch stop layer 210 and the formation of the capping layer 218. The deposition of the etch stop layer 210 and the capping layer 218 may both be performed at elevated temperatures, for example, with the in-situ formation, the respective wafer (in which the device 200 is located) may be heated continuously, and there may be no need to cool down the wafer and heat the wafer again between the formation of the etch stop layer 210 and the formation of the capping layer 218. This results in less thermal budget.

The precursor for forming the capping layer 218 may include $SiH_4$, $Si(CH_3)_4$ (4MS), $Si(CH_3)_3H$ (3MS), methyl-diethoxysilane (mDEOS), and combinations thereof. In an embodiment in which the etch stop layer 210 and the capping layer 218 have a common precursor (such as 3MS and/or 4MS as silicon-based monomer for forming the etch stop layer 210), after the formation of the etch stop layer 210, additional precursors may be added if necessary to continue to form the capping layer 218. In an embodiment in which the capping layer 218 is formed of ODC, the precursor may include $CO_2$, $Si(CH_3)_4$, $Si(CH_3)_3H$, He, $O_2$, $N_2$, Xe and the like. In some embodiments, the capping layer 218 is a nitrogen-free layer. The thickness of the capping layer 218 may be between about 20 Å to about 50 Å. In a specific example, the capping layer 218 is an ODC layer of about 30 Å, and the etch stop layer 210 is less than about 30 Å, such as about 20 Å.

Figure 10:
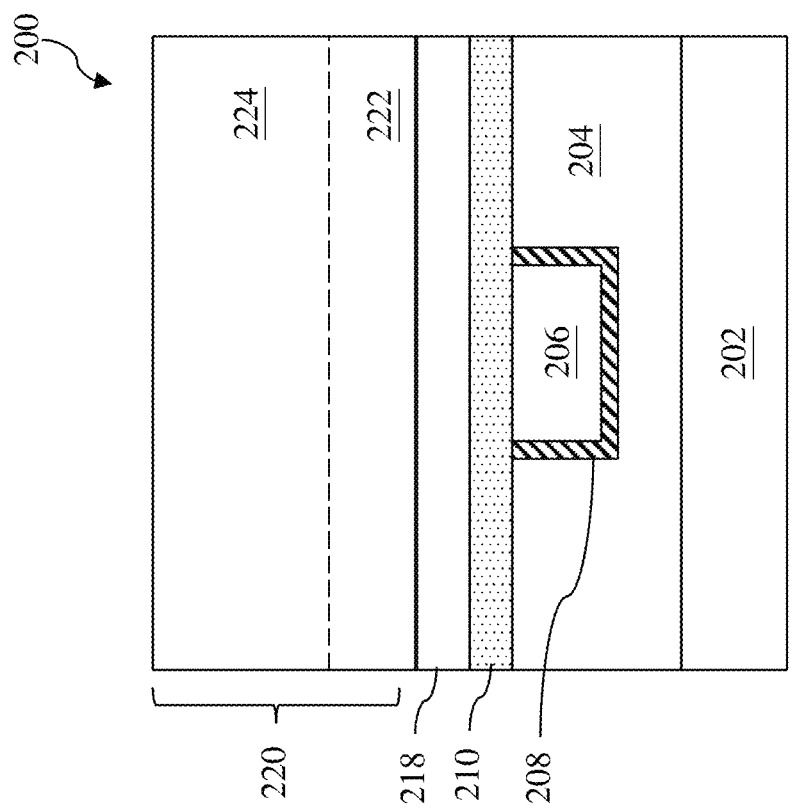

After the capping layer 218 is formed, damascene processes may be performed to form overlying structures, for example, a via and an overlying metal line (e.g., a copper line). As is known in the art, the via and its overlying metal line can be formed by either a single damascene process or a dual damascene process. Referring to FIGS. 1 and 10, the method 100 proceeds to operation 110 to form a dielectric layer 220 over the capping layer 218. In some embodiments, the dielectric layer 220 is one of the IMD layers. In furtherance of the embodiments, the dielectric layer 220 may further include a via IMD layer 222 and a trench IMD layer 224. The via IMD layer 222 is first formed over the capping layer 218. The via IMD layer 222 may be a low-k dielectric layer having a k value less than about 3.5 or an ultra low-k dielectric layer having a k value of less than about 2.7, and may comprise carbon-doped silicon oxide, fluorine-doped silicon oxide, organic low-k material, and porous low-k material. The formation method includes spin-on, chemical vapor deposition (CVD) or other known methods. The trench IMD layer 224 is then formed over the via IMD layer 222. Trench IMD layer 224 may be formed using similar methods and similar materials as the via IMD layer 222. In some embodiments, the trench IMD layer 224 and the via IMD layer 222 are formed of porous materials.

Figure 11:
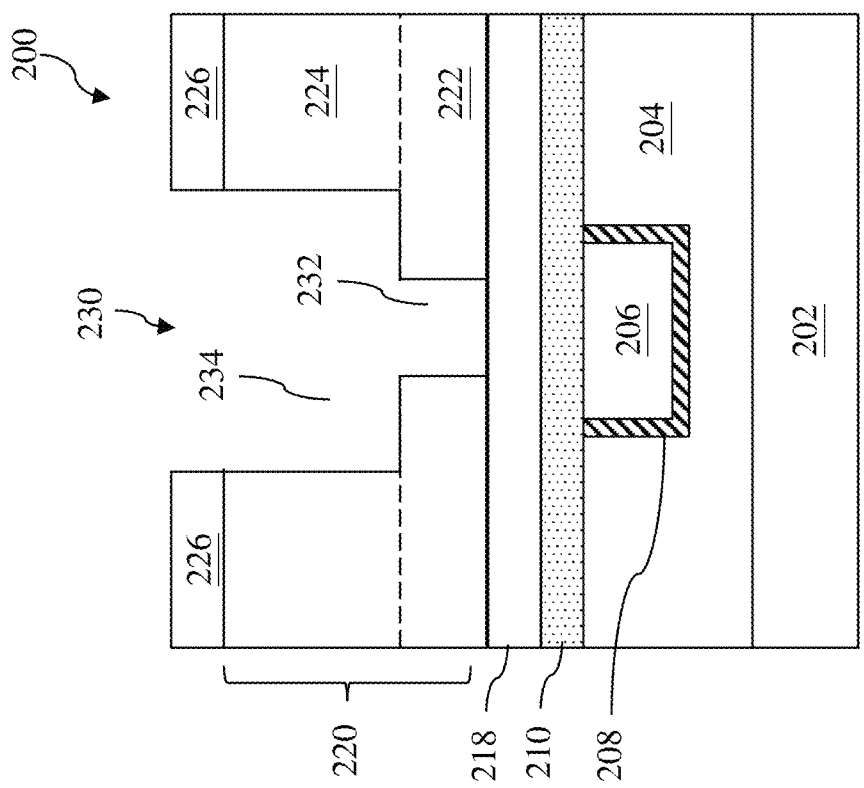

Referring to FIGS. 1 and 11, the method 100 proceeds to operation 112 to form an opening 230 in the dielectric layer 220 through one or more etching processes, where the opening 230 is at least partially aligned with the underlying conductive feature 206. In the illustrated embodiment, the opening 230 includes the via opening 232 and the trench opening 234. The formation of the via opening 232 and the trench opening 234 may be assisted by photoresists for defining patterns. FIG. 11 illustrates photoresist 226 for defining the pattern of the trench opening 234. Notice that the capping layer 218 is nitrogen-free, and hence the adverse effects of nitrogen to the photoresist (known as PR poison) is substantially eliminated since the capping layer 218 prevents nitrogen from beneath to be released to photoresist 226. Particularly, the capping layer 218 may also prevent nitrogen from poisoning the photoresist (not shown) when via opening 232 is formed. Photoresist 226 is then removed in a suitable process such as resist stripping or oxygen ashing.

Figure 12:
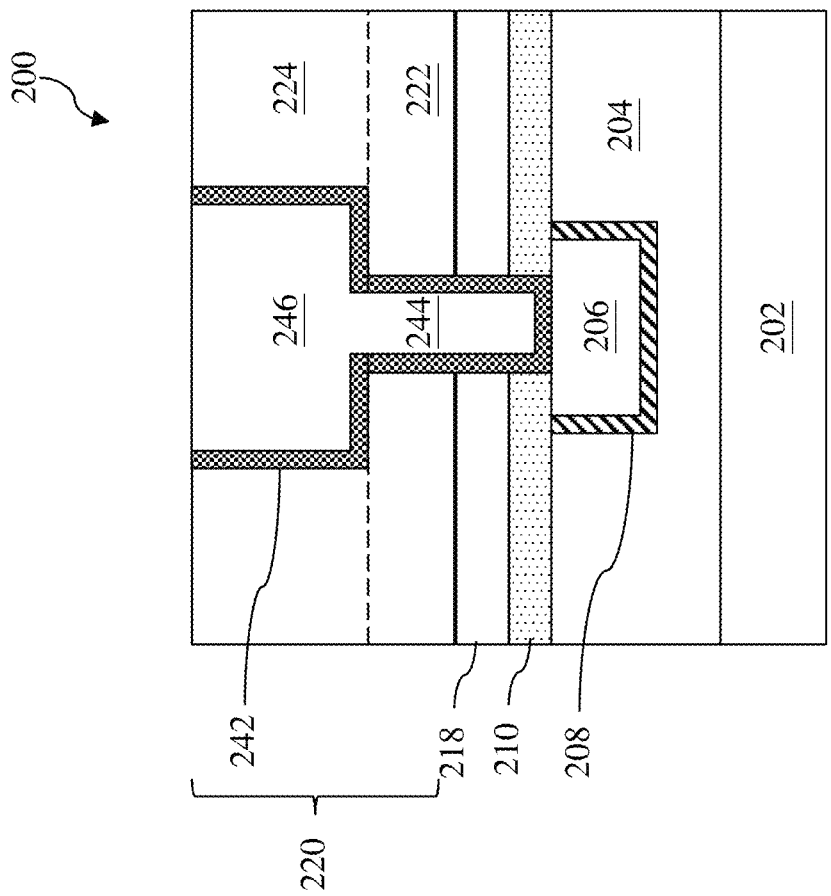

Referring to FIGS. 1 and 12, the method 100 proceeds to operation 114 to fill the opening 230 with a conductive material. Opening 230 includes an etching process to remove a portion of capping layer 218 and the etch stop layer 210 from the bottom of the via opening 232 and expose the underneath conductive feature 206. In subsequent steps, a diffusion barrier layer 242 is formed. The remaining via opening 232 and trench opening 234 are then filled with conductive materials such as copper or copper alloys. A chemical mechanical polish (CMP) is then performed to remove excess materials. The remaining portion of the conductive material forms via 244 and conductive line 246.

Figure 13:
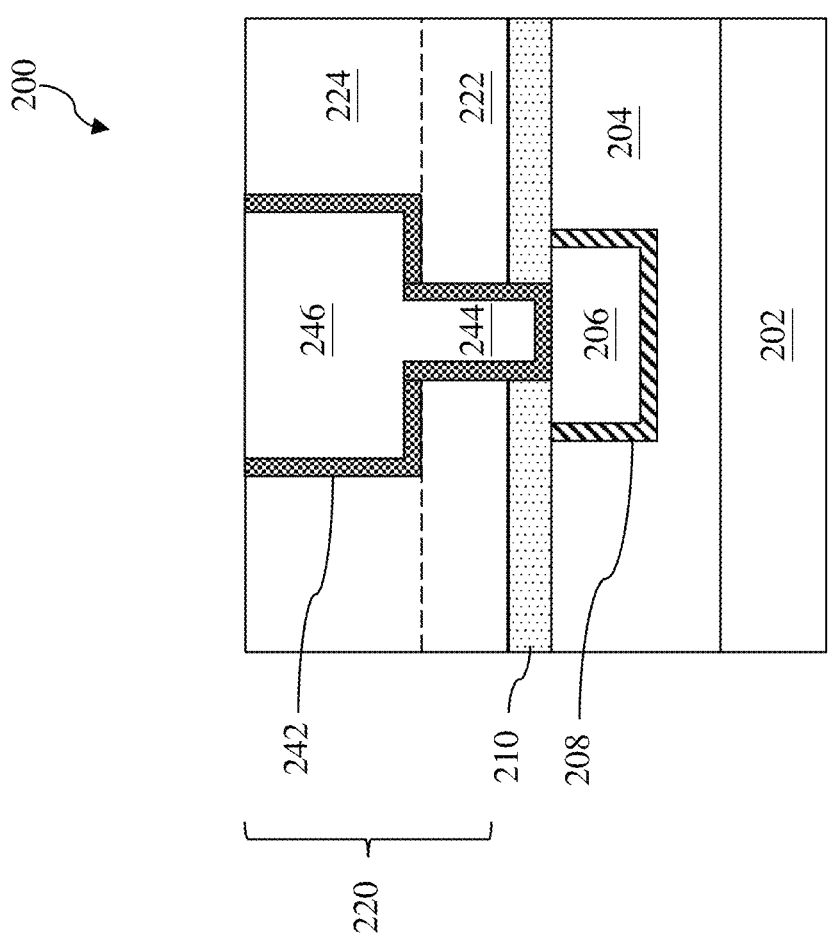

Referring to FIG. 13, in an alternative embodiment, the method 100 may skip the formation of the capping layer 218 (i.e., operation 108) and form the dielectric layer 220 directly above the etch stop layer 210. In a specific embodiment, without the capping layer 218 thereabove, the etch stop layer 210 has a thickness less than about 50 Å, such as about 40 Å. The method 100 may perform further subsequent operations to complete the fabrication of device 200. For example, method 100 may include operations of forming higher layers of the multilayer interconnection (MLI) structure and forming metal interconnects connecting gates or source/drain features of transistors to other portions of the device 200 to form a complete IC.

Although not intended to be limiting, one or more embodiments of the present disclosure provide many benefits to a semiconductor device and the formation thereof. For example, embodiments of the present disclosure provide an etch stop layer with a thickness of merely tens of Angstroms. The etch stop layer is substantially free of hydroxyl group, which protects underneath conductive features from being oxidized. Parasitic capacitance is also reduced, and operation speed of the integrated circuit is further increased. Furthermore, the etch stop layer formation method can be easily integrated into existing semiconductor fabrication processes.

In one exemplary aspect, the present disclosure is directed to a method. The method includes providing a dielectric layer; forming a metal line in the dielectric layer; forming an etch stop layer on the metal line, wherein the etch stop layer includes a metal atom bonded with a hydroxyl group; performing a treatment process to the etch stop layer to displace hydrogen in the hydroxyl group with an element other than hydrogen; partially etching the etch stop layer to expose the metal line; and forming a conductive feature above the etch stop layer and in physical contact with the metal line. In some embodiments, the treatment process includes a plasma treatment containing nitrogen and the element is nitrogen. In some embodiments, the treatment process includes depositing a dopant and the element is silicon. In some embodiments, the dopant includes a silicon-based monomer. In some embodiments, the silicon-based monomer includes at least a functional group selected from methyl, ethyl, or phenyl. In some embodiments, after the performing of the treatment process, the etch stop layer includes an M-O—Si group, M representing the metal atom.

In some embodiments, after the performing of the treatment process, the etch stop layer includes a Si—O—Si group. In some embodiments, the Si—O—Si group is part of an M-O—Si—O—Si-M group, M representing the metal atom. In some embodiments, the metal atom is selected from one of Hafnium, Zirconium, and Aluminum. In some embodiments, the treatment process includes a two-step heating process with a first temperature and subsequently a second temperature higher than the first temperature. In some embodiments, the element has a higher concentration in an upper portion of the etch stop layer than in a lower portion of the etch stop layer. In some embodiments, the method further includes forming a capping layer on the etch stop layer, wherein the forming of the capping layer and the performing of the treatment process include using the same precursor.

In another exemplary aspect, the present disclosure is directed to a method. The method includes providing a substrate having a first dielectric layer and a conductive feature that is embedded in the first dielectric layer; forming an etch stop layer on the first dielectric layer and the conductive feature, wherein the etch stop layer includes a metal oxide; deposit a silicon-containing dopant to the etch stop layer, wherein the silicon-containing dopant reacts with the metal oxide and creates a M-O—Si group, M representing a metal atom in the metal oxide; forming a second dielectric layer on the etch stop layer; and forming a conductive structure in the second dielectric layer, wherein the conductive structure is electrically connected with the conductive feature. In some embodiments, the silicon-containing dopant is a monomer with four functional groups bonded with a silicon atom. In some embodiments, at least one of the four functional groups is selected from methyl, ethyl, or phenyl. In some embodiments, the method further includes a plasma surface treatment after the depositing of the silicon-containing dopant. In some embodiments, after the depositing of the silicon-containing dopant, the etch stop layer is substantially free of a hydroxyl group.

In yet another exemplary aspect, the present disclosure is directed to a semiconductor device. The semiconductor device includes a first conductive element disposed in a first dielectric layer; an etch stop layer disposed on the first dielectric layer, wherein the etch stop layer includes a M-O—X group, M representing a metal element, X representing an element other than hydrogen; a second dielectric layer disposed on the etch stop layer; and a second conductive element embedded in the second dielectric layer and through the etch stop layer, wherein the second conductive element is in physical contact with the first conductive element. In some embodiments, the element other than hydrogen has a higher concentration in an upper portion of the etch stop layer than in a lower portion of the etch stop layer. In some embodiments, the etch stop layer has a thickness less than 50 Å.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a first conductive feature disposed in a top portion of the substrate;
a metal containing layer disposed on the first conductive feature and in physical contact with a top surface of the substrate, the metal containing layer including a N-M-O—X group, M representing a metal atom, O representing an oxygen atom, X representing an element other than hydrogen, and N representing a nitrogen atom; and
a second conductive feature disposed on and through the metal containing layer and in physical contact with the first conductive feature.

2. The semiconductor device of claim 1, wherein the element other than hydrogen has a higher concentration in an upper portion of the metal containing layer than in a lower portion of the metal containing layer.

3. The semiconductor device of claim 1, wherein the element other than hydrogen has a concentration that peaks at a top surface of the metal containing layer and decreases inside the metal containing layer with a depth further away from the top surface of the metal containing layer.

4. The semiconductor device of claim 1, wherein the metal atom is selected from one of hafnium, zirconium, and aluminum.

5. The semiconductor device of claim 4, wherein the metal atom is aluminum.

6. The semiconductor device of claim 1, wherein the element other than hydrogen is silicon.

7. The semiconductor device of claim 1, wherein the metal containing layer includes an X—O—X group.

8. The semiconductor device of claim 1, wherein the N-M-O—X group is part of a N-M-O—X—O—X—O group.

9. The semiconductor device of claim 1, wherein the N-M-O—X group is part of a N-M-O—X—R group, R representing a functional group selected from one of methyl, ethyl, and phenyl.

10. The semiconductor device of claim 1, wherein the first conductive feature is selected from one of a source/drain feature and a gate electrode.

11. A semiconductor device, comprising:
a substrate having a first dielectric layer and a conductive feature embedded in the first dielectric layer;
an etch stop layer on the first dielectric layer and the conductive feature, the etch stop layer including an N-M-O—X group, N representing nitrogen, M representing a metal, O representing oxygen, and X representing an element other than hydrogen;
a second dielectric layer on the etch stop layer; and
a conductive structure embedded in the second dielectric layer, wherein the conductive structure is electrically connected with the conductive feature.

12. The semiconductor device of claim 11, wherein the etch stop layer has a density about 3.3 g/cm$^3$.

13. The semiconductor device of claim 11, wherein the etch stop layer has a thickness less than about 50 Å.

14. The semiconductor device of claim 11, wherein the metal is aluminum and the element other than hydrogen is silicon.

15. The semiconductor device of claim 11, wherein the etch stop layer further includes carbon containing functional groups linked to the element other than hydrogen.

16. The semiconductor device of claim 11, wherein at least one of the carbon containing functional groups is an aromatic ring.

17. The semiconductor device of claim 11, wherein a bottom portion of the conductive structure is surrounded by the etch stop layer.

18. A semiconductor device, comprising:
a substrate having a first dielectric layer and a conductive feature embedded in the first dielectric layer;
a metal containing layer on the first dielectric layer and the conductive feature, the metal containing layer including an M-O—Si—O—Si—O group forming a ring of six atoms, M representing a metal, Si representing silicon, O representing oxygen; and
a conductive structure through the metal containing layer and in physical contact with the conductive feature.

19. The semiconductor device of claim 18, wherein the metal containing layer includes the metal selected from one of hafnium, zirconium, and aluminum.

20. The method of claim 18, wherein the metal is further bonded to a nitrogen.

* * * * *